(12) United States Patent
Aoki et al.

(10) Patent No.: US 9,520,375 B2
(45) Date of Patent: Dec. 13, 2016

(54) METHOD OF FORMING A SOLDER BUMP ON A SUBSTRATE

(71) Applicant: International Business Machines Corporation, Armonk, NY (US)

(72) Inventors: Toyohiro Aoki, Yokohama (JP); Hiroyuki Mori, Yasu (JP); Yasumitsu K. Orii, Higashiomi (JP); Kazushige Toriyama, Kyoto (JP); Shintaro Yamamichi, Kunitachi (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/700,420

(22) Filed: Apr. 30, 2015

(65) Prior Publication Data

US 2016/0322319 A1    Nov. 3, 2016

(51) Int. Cl.
*H01L 23/00* (2006.01)

(52) U.S. Cl.
CPC ........ *H01L 24/11* (2013.01); *H01L 2224/1162* (2013.01); *H01L 2224/11462* (2013.01); *H01L 2224/11614* (2013.01); *H01L 2224/11849* (2013.01); *H01L 2224/13083* (2013.01); *H01L 2224/13147* (2013.01); *H01L 2224/13166* (2013.01); *H01L 2224/13184* (2013.01); *H01L 2924/0105* (2013.01); *H01L 2924/01028* (2013.01); *H01L 2924/0132* (2013.01)

(58) Field of Classification Search
CPC ............ H01L 2224/11462; H01L 2224/11614; H01L 2224/1162; H01L 2224/11849; H01L 2224/13083; H01L 2224/13147; H01L 2224/13166; H01L 2224/13184
See application file for complete search history.

(56) References Cited

U.S. PATENT DOCUMENTS

| | | | |
|---|---|---|---|
| 6,413,851 B1 * | 7/2002 | Chow | ................. H01L 21/2885 257/E21.175 |
| 2005/0026416 A1 | 2/2005 | Cheng et al. | |
| 2008/0083985 A1 | 4/2008 | Lee et al. | |
| 2011/0101520 A1 | 5/2011 | Liu et al. | |
| 2011/0156248 A1 * | 6/2011 | Matsuki | .................. H01L 24/03 257/737 |
| 2011/0239456 A1 * | 10/2011 | Conn | ................... H05K 3/3436 29/840 |

* cited by examiner

*Primary Examiner* — Mamadou Diallo
(74) *Attorney, Agent, or Firm* — Vazken Alexanian; Michael J. Chang, LLC

(57) ABSTRACT

A method of forming a solder bump on a substrate includes: forming a conductive layer(s) on the substrate having a surface on which an electrode pad is prepared; forming a resist layer on the conductive layer(s) having an opening over the electrode pad; forming a metal pillar in the opening of the resist layer, wherein the metal pillar includes a first conductive material; forming a space between sidewalls of the resist layer and the metal pillar; forming a metal barrier layer in the space and on a top surface of the metal pillar, the metal barrier layer including a second conductive material that is different from the first conductive material of the metal pillar; forming a solder layer on the metal barrier layer over the top surface of the metal pillar; removing the resist layer; removing the conductive layer(s); and forming the solder bump by reflowing the solder layer.

18 Claims, 6 Drawing Sheets

METHOD OF FORMING A SOLDER BUMP ON A SUBSTRATE

FIELD OF THE INVENTION

The present invention relates to a method of forming a solder bump on a substrate, and more specifically, to a method of forming a fine solder bump using a metal pillar.

BACKGROUND OF THE INVENTION

Flip chip packaging is broadly applied in consumer products such as smart phones, tablets, personal computers (PC), etc. to the supercomputer. Furthermore, it is predicted that the demand of flip chip packaging will increase sharply due to the appearance of three-dimensional lamination devices of the semiconductor chip using through-silicon via (TSV) technology.

In order to realize high performance in electronics devices, the pitch between bumps needs to be smaller. As a result, however, the potential for reliability problems, such as a crack, to arise in a bumping step or a packaging step becomes high as the bump's size and the pitch between bumps become smaller.

In the bumping step, a fine copper (Cu) pillar bump is generally formed by an electroplating method using a seed layer. In that case, when etching the seed layer undesirable undercutting of the Cu pillar or over etching of the sidewalls of the Cu pillar arises. FIG. 1 shows an example of undercutting and over etching of the Cu pillar bump which arises after etching of the seed layer. Therefore, there is a need for fine flip chip package technology, solving such problems.

SUMMARY OF THE INVENTION

The present invention provides a method of forming a solder bump on a substrate which includes: forming at least one conductive layer on the substrate, wherein the substrate has a surface on which an electrode pad is prepared; forming a resist layer on the at least one conductive layer, the resist layer having an opening over the electrode pad; forming a metal pillar in the opening of the resist layer, wherein the metal pillar includes a first conductive material; forming a space between a sidewall of the resist layer and a sidewall of the metal pillar; forming a metal barrier layer in the space and on a top surface of the metal pillar, wherein the metal barrier layer includes a second conductive material which is different from the first conductive material of the metal pillar; forming a solder layer on the metal barrier layer over the top surface of the metal pillar; removing the resist layer; removing the at least one conductive layer; and forming the solder bump by reflowing the solder layer In one aspect of the present invention, the step of forming the resist layer includes thermally curing a resist material deposited on the substrate.

In another aspect of the present invention, the step of forming the space between the sidewall of the resist layer and the sidewall of the metal pillar includes heating the resist layer at a temperature higher than a temperature which thermally cures the resist material.

In another aspect of the present invention, the step of forming the space between the sidewall of the resist layer and the sidewall of the metal pillar includes exposing the resist layer using light to shrink the resist material.

In another aspect of the present invention, the step of forming the metal pillar includes electroplating the first conductive material in the opening of the resist layer so as to leave a cavity from a top surface of the resist layer of a predetermined depth in the opening.

In another aspect of the present invention, the step of forming the metal barrier layer includes electroplating the second conductive material in the opening in which the space has been formed.

In another aspect of the present invention, the step of forming the solder layer includes electroplating a solder material from a top surface of the metal barrier layer to a top surface of the resist layer in the opening of the resist layer.

In another aspect of the present invention, the step of forming the metal barrier layer includes forming a solder material in the opening in which the space has been formed using an Injection Molded Solder (IMS) process.

In another aspect of the present invention, the first conductive material includes Cu, and the second conductive material includes a Ni or Sn based intermetallic compound.

In another aspect of the present invention, the step of forming the at least one conductive layer includes the steps of: forming a first conductive layer on the substrate; and forming a second conductive layer on the first conductive layer.

In another aspect of the present invention, the first conductive layer includes Ti or TiW, and the second conductive layer includes Cu.

In another aspect of the present invention, the step of removing the at least one conductive layer includes etching the second conductive layer.

In another aspect of the present invention, the invention further includes a step of etching the first conductive layer after the solder bump has been formed.

A more complete understanding of the present invention, as well as further features and advantages of the present invention, will be obtained by reference to the following detailed description and drawings.

DETAILED DESCRIPTION OF PREFERRED EMBODIMENTS

Figure 1:
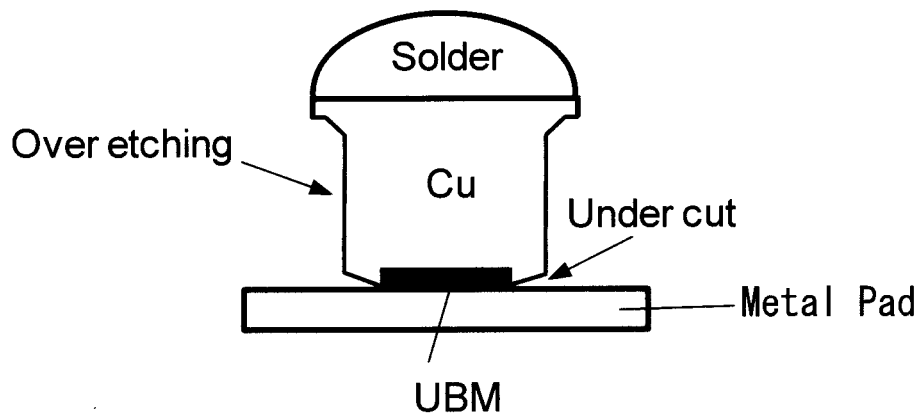
FIG. 1 shows an example of undercutting and over etching of the Cu pillar bump which arises after etching of the seed layer.
Figure 2:
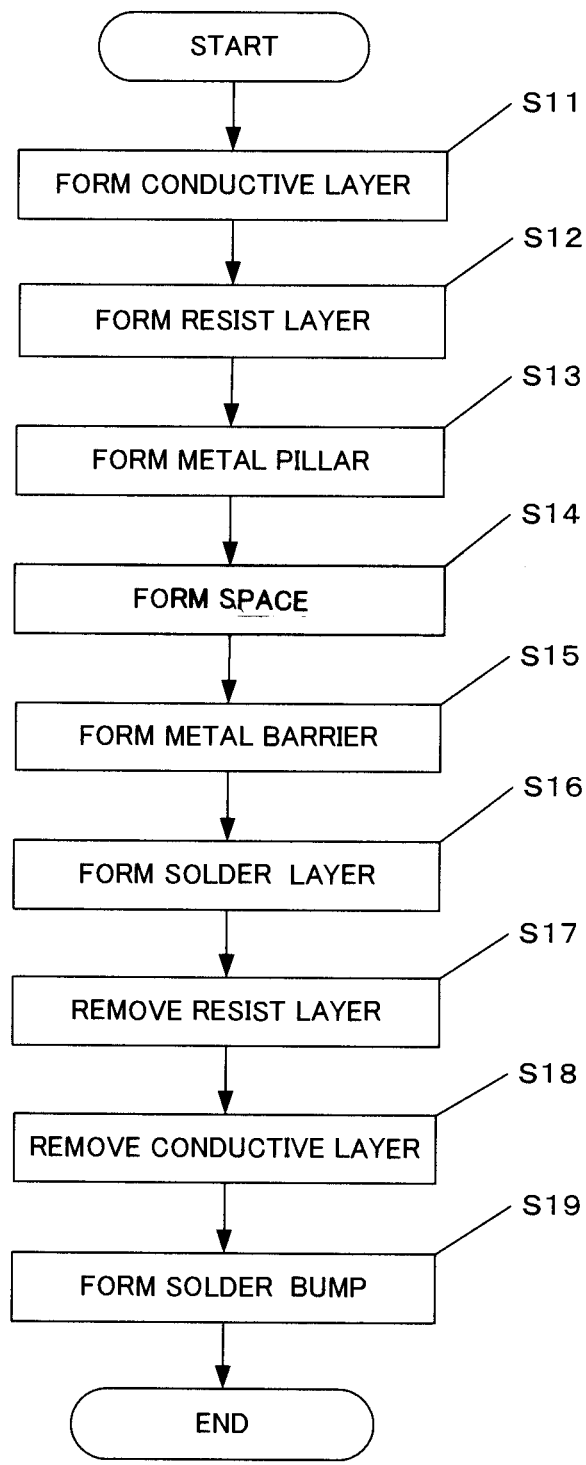
FIG. 2 is a chart showing a flow of the method according to an embodiment of the present invention.

The following is an explanation of an embodiment of the present invention with reference to the drawings. FIG. 2 is a flowchart of the method of the present invention. Each of FIG. 3 to FIG. 14 shows cross-sectional diagrams of the structure at each step in the flowchart of FIG. 2. The cross-sectional diagrams show a part of a substrate 10. The following is an explanation of the method of the present invention with reference to FIG. 2 to FIG. 14.

Figure 3:
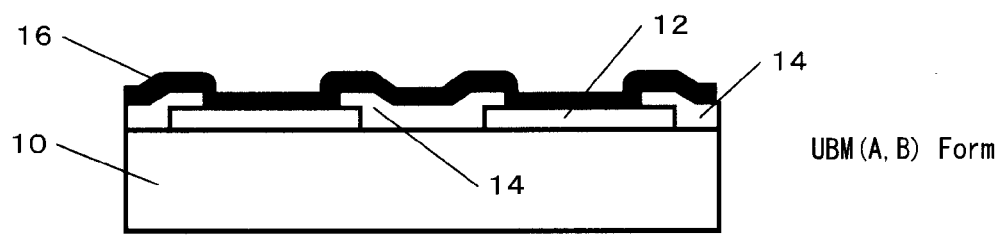
FIG. 3 is a cross-sectional diagram illustrating at least one conductive (seed) layer having been formed on a substrate according to an embodiment of the present invention.

Referring to FIG. 2 and FIG. 3, in step S11, a substrate 10 is prepared. The substrate 10 has a surface on which electrode pads 12 have been formed between insulating layers 14. The substrate 10 may include a semiconductor wafer such as a silicon (Si) wafer, or a semiconductor chip/die. The material of the semiconductor wafer or chip/die is not limited to specific types. The substrate 10 may include a plurality of wiring layers (including devices such as a transistor) and insulating layers. The substrate 10 may be formed by the lamination of a plurality of semiconductor substrates.

In step S11, at least one conductive (seed) layer 16 is formed on the substrate 10. The at least one conductive layer 16 is also referred to herein as a seed layer or UBM (Under Barrier Metal). The at least one conductive layer 16 may include a plurality of conductive layers. The conductive layers may include a first conductive layer (A), and a second conductive layer (B) on the first conductive layer. The first conductive layer (A) may include, for example, titanium (Ti) or titanium tungsten (TiW). The second conductive layer (B) may include, for example, copper (Cu). The at least one conductive layer 16 may be formed, for example, by a conventional thin-film formation technique such as sputtering or plasma chemical vapor deposition (CVD).

Figure 4:
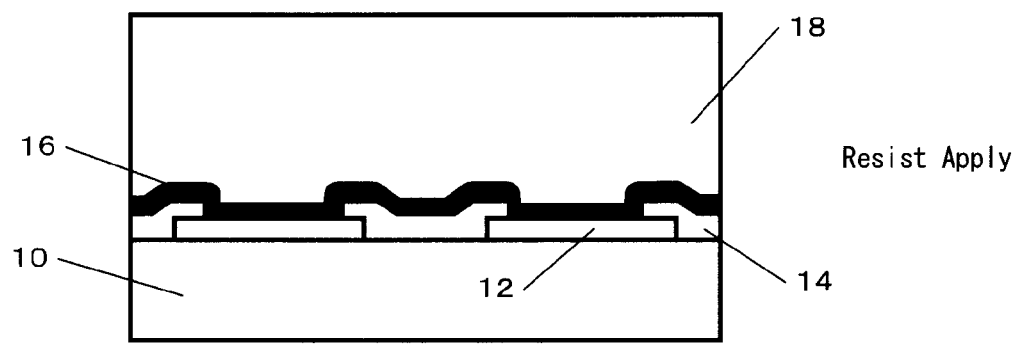
FIG. 4 is a cross-sectional diagram illustrating a resist layer having been formed on the substrate according to an embodiment of the present invention.

Referring to FIG. 2, and FIGS. 4 to 6, in step S12, a resist layer 18 is next formed on the substrate 10 as shown in FIG. 4. A resist material is applied (i.e., deposited) on the substrate 10 using spin coating for example, and cured at a predetermined temperature to form the resist layer 18. The resist material may include light (UV)-curable resin (photopolymer) or thermosetting resin (polymer). As the resist material, a photoresist (e.g., JSR-151) commercially available from JSR Corporation (Tokyo, Japan) may be used, for example. The resist layer 18 may be either a negative type resist or positive type resist. Use of a negative type resist as the resist layer 18 is shown illustrated in the figures.

Figure 5:
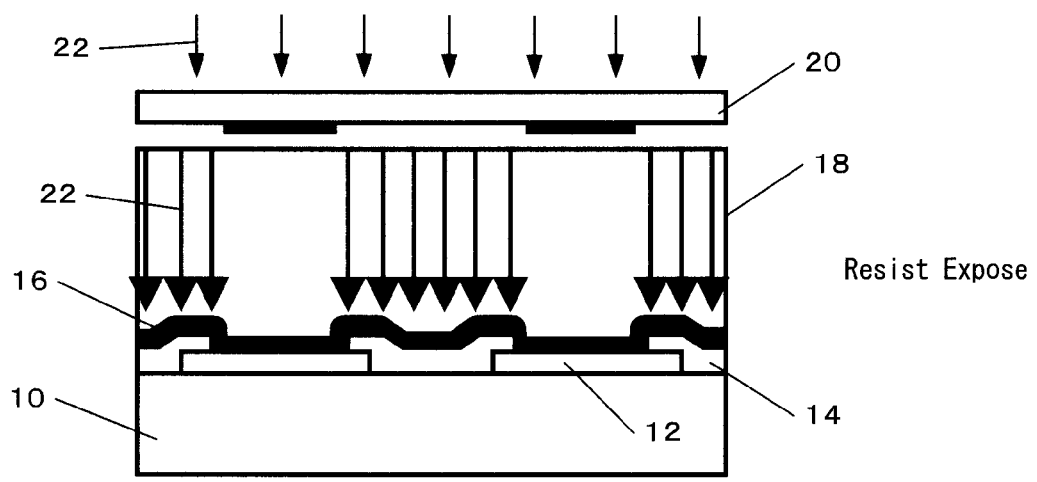
FIG. 5 is a cross-sectional diagram illustrating the resist layer being exposed using light induced through a photo mask according to an embodiment of the present invention.
Figure 6:
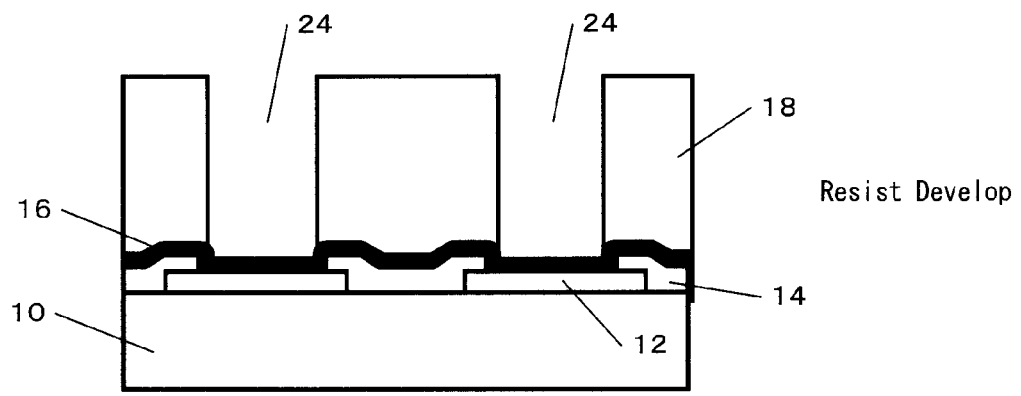
FIG. 6 is a cross-sectional diagram illustrating the exposed resist layers having been developed, and openings having been formed over the electrode pads according to an embodiment of the present invention.

The resist layer 18 is then exposed using light 22 induced through a photo mask 20 as shown in FIG. 5. The exposure is performed to expose only the resist region over the insulating layers 14 without exposing the resist region over the electrode pads 12. Next, the exposed resist layers 18 are developed, and openings 24 are formed over the electrode pads 12 as shown in FIG. 6. The openings 24 expose the surface of the conductive layer 16 (e.g., the second conductive layer (B)) on the electrode pads 12.

Figure 7:
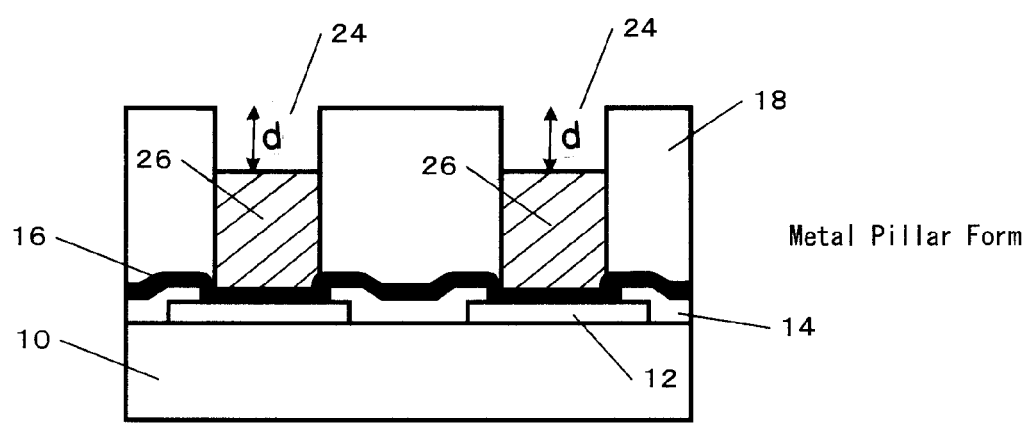
FIG. 7 is a cross-sectional diagram illustrating metal pillars having been formed in the openings according to an embodiment of the present invention.

Referring to FIG. 2 and FIG. 7, in step S13, metal pillars 26 are formed in the openings 24. The metal pillars 26 may be formed by electroplating a first conductive material in the openings 24 of the resist layer 18 leaving a cavity from the top surface of the resist layer 18 of a predetermined depth d in the opening 24. The first conductive material may include Cu, for example. The metal pillars 26 can also be formed by other conventional metal formation techniques such as sputtering or plasma CVD.

Figure 8:
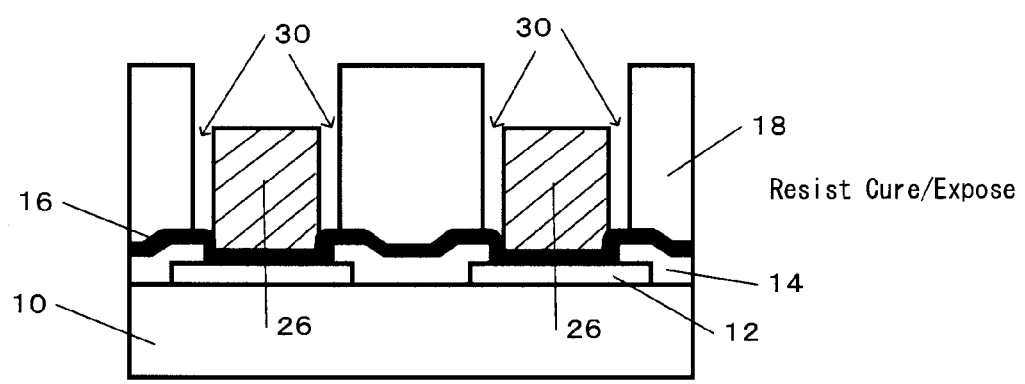
FIG. 8 is a cross-sectional diagram illustrating a space (gap) having been formed between the sidewall of the resist layer and the sidewall of the metal pillars according to an embodiment of the present invention.

Referring to FIG. 2 and FIG. 8, in step S14, a space (gap) 30 is formed between the sidewall of the resist layer 18 and the sidewall of the metal pillars 26. The space 30 may be formed by heating the resist layer 18 at a temperature higher than the predetermined temperature which thermally cures the applied resist material 18 in the step S12. The space 30 is generated due to the heated resist being shrunk in step S14. In this case, for the resist material, materials with a property to shrink by heating (thermal energy) are selected beforehand (a suitable, commercially available resist material was provided above). The heating temperature may be over 200 degrees Celsius (° C.) (for example, 230° C.). The heating time of the resist layer 18 in step S14 is longer than the curing time of the applied resist material 18 in step S12. For example, the heating time of the resist layer 18 in step S14 may be from several ten minutes to one hour.

Alternatively, in step S14 the space 30 can be formed by exposing the resist layer 18 using light to shrink the resist layer (material) with or without heating. In this case, for the resist material, materials with a property to shrink by light (photon energy) are selected beforehand. The exposure or the heating can be equivalent to a kind of an additional cure of the resist layer 18. The exposure (cure) time can be defined according to the kind of resist material, etc.

Figure 9:
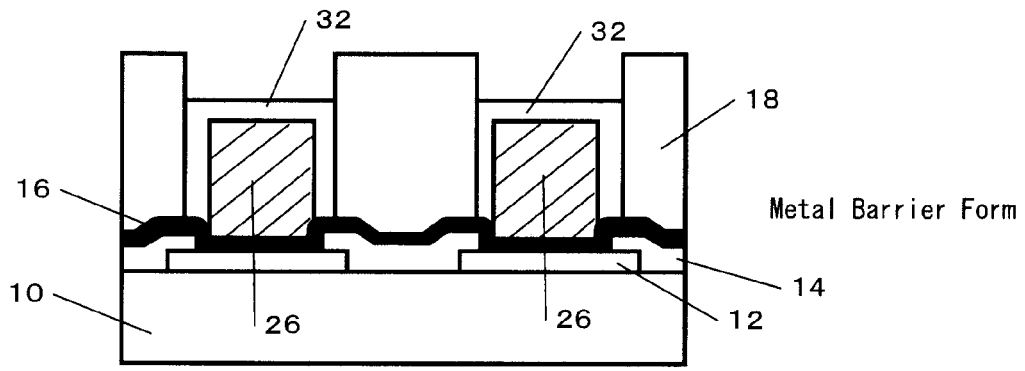
FIG. 9 is a cross-sectional diagram illustrating a metal barrier layer having been formed in the space and on a top surface of the metal pillars according to an embodiment of the present invention.

Referring to FIG. 2 and FIG. 9, in step S15, a metal barrier layer 32 is formed in the space 30 and on a top surface of the metal pillars 26. The metal barrier layer 32 may be formed by electroplating a second conductive material which is different from the first conductive material of the metal pillars 16. The second conductive material can be selected from conductive materials which have low wettability of solder. For example, the second material may include a nickel (Ni) or tin (Sn) based intermetallic compound. The second material may include a solder material.

The metal barrier layer 32 can also be formed by other metal formation techniques such as Injection Molded Solder (IMS) method. In case of using IMS method, the metal barrier layer 32 and a solder layer 34 in the next step S16 can be simultaneously formed, and a flux apply process and reflow process in the later step S19 are not required.

Figure 10:
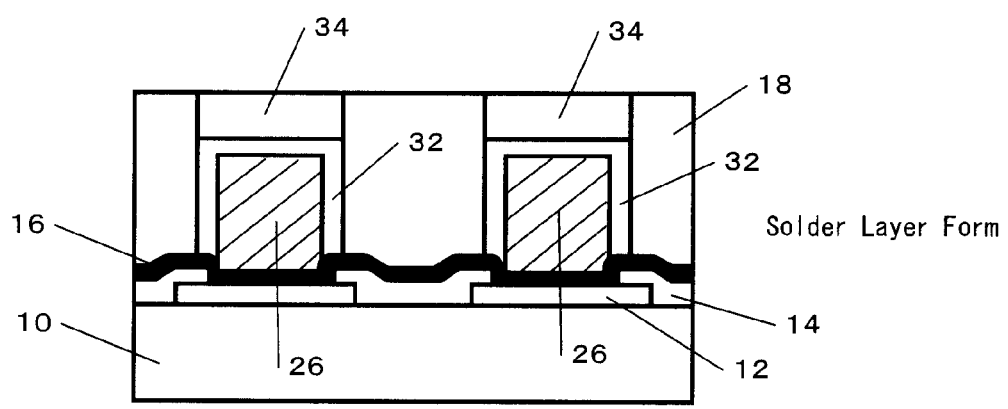
FIG. 10 is a cross-sectional diagram illustrating a solder layer having been formed on the metal barrier layer on the surface of the metal pillars according to an embodiment of the present invention.

Referring to FIG. 2 and FIG. 10, in step S16, a solder layer 34 is formed on the metal barrier layer 32 on the surface of the metal pillars 26. The solder layer 34 may be formed by electroplating solder material from the top surface of the metal barrier layer 32 to the top surface of the resist layer 18 in the opening of the resist layer 18. The solder layer 34 may include at least one solder material. The solder material may include a lead (Pb)-free solder metal containing at least one metal selected from the group consisting of elemental Sn, silver (Ag), gold (Au), Cu, Ni, bismuth (Bi), indium (In), zinc (Zn), cobalt (Co), germanium (Ge), iron (Fe) and titanium (Ti), and containing Sn or In as a main component.

Figure 11:
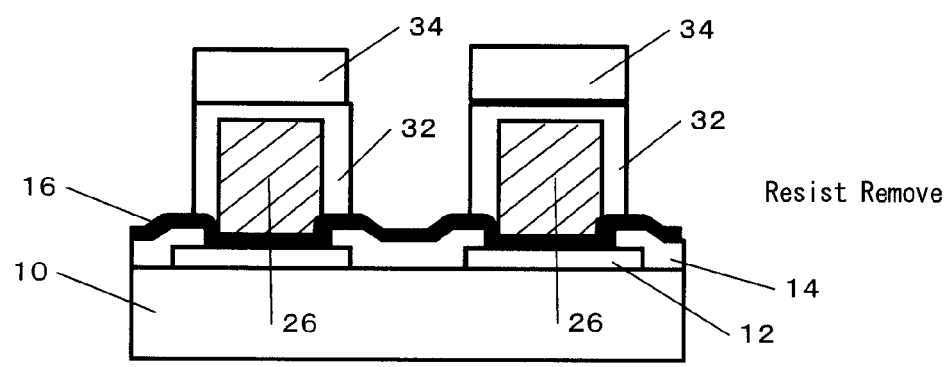
FIG. 11 is a cross-sectional diagram illustrating the resist layer having been removed according to an embodiment of the present invention.

Referring to FIG. 2 and FIG. 11, in step S17, the resist layer 18 is removed using conventional resist removing liquid. As a result, the surface of the conductive seed layer 16, more exactly, the surface of the second conductive layer (B) which constitutes the at least one conductive seed layer (UBM) 16 is exposed.

Figure 12:
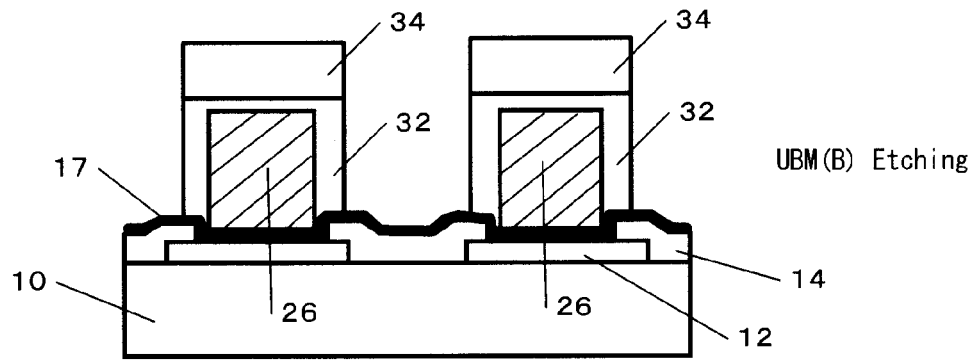
FIG. 12 is a cross-sectional diagram illustrating a second conductive layer (B) of the at least one conductive layer having been etched thereby exposing a first conductive layer (A) of the at least one conductive layer according to an embodiment of the present invention.

Referring to FIG. 2 and FIG. 12, in step S18, only the second conductive layer (B) which constitutes the at least one conductive layer 16 is etched using conventional etching liquid. As a result, the first conductive layer (A) 17 on the insulating layer 14 is exposed as shown in FIG. 12. In step S18, the metal barrier layer 32 functions to protect the metal pillars 26 from the etching.

Figure 13:
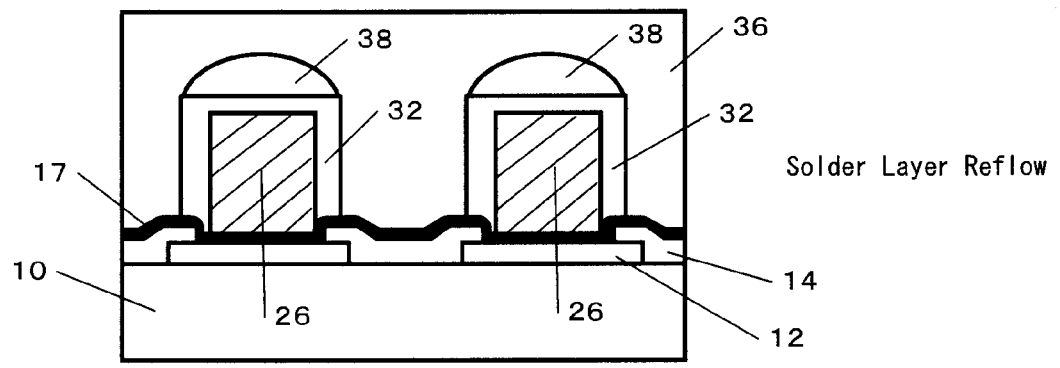
FIG. 13 is a cross-sectional diagram illustrating flux having been applied on the substrate, and the solder layer having been reflowed according to an embodiment of the present invention.

Referring to FIG. 2 and FIG. 13, in step S19, flux 36 is applied on the substrate 10, and the solder layer 34 is reflowed at a predetermined temperature. As a result, a solder bump 38 is formed on the metal pillars 26. After the reflowing, the substrate 10 is cleaned, and flux 36 is removed.

Figure 14:
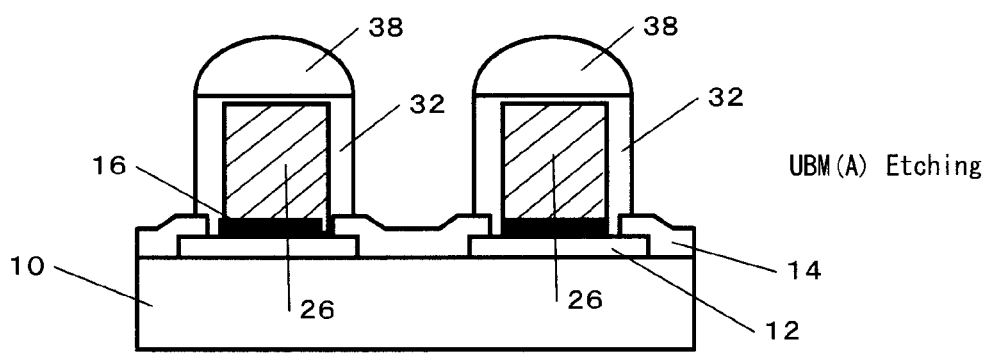
FIG. 14 is a cross-sectional diagram illustrating the first conductive layer (A) of the at least one conductive layer having been etched according to an embodiment of the present invention.

Referring to FIG. 14, the first conductive layer (A) which constitutes the at least one conductive layer 16 is etched using a conventional etching liquid. As a result, the insulating layer 14 is exposed as shown in FIG. 14. The metal barrier layer 32 functions to protect the metal pillars 26 from the etching like it does in the case of the etching of the second conductive layer (B) in step S18.

The embodiments of the present invention have been described with reference to the accompanying drawings. However, the present invention is not limited to the embodiment. The present invention can be carried out in forms to which various improvements, corrections, and modifications are added based on the knowledge of those skilled in the art without departing from the purpose of the present invention.

What is claimed is:

1. A method of forming a solder bump on a substrate, comprising the steps of:
    forming at least one conductive layer on the substrate, wherein the substrate has a surface on which an electrode pad is prepared;
    forming a resist layer on the at least one conductive layer, the resist layer having an opening over the electrode pad;
    forming a metal pillar in the opening of the resist layer, wherein the metal pillar comprises a first conductive material;
    forming a space between a sidewall of the resist layer and a sidewall of the metal pillar, wherein the step of forming the space between the sidewall of the resist layer and the sidewall of the metal pillar includes exposing the resist layer using light to shrink the resist layer;
    forming a metal barrier layer in the space and on a top surface of the metal pillar, wherein the metal barrier layer comprises a second conductive material which is different from the first conductive material of the metal pillar;
    forming a solder layer on the metal barrier layer over the top surface of the metal pillar;
    removing the resist layer;
    removing the at least one conductive layer; and
    forming the solder bump by reflowing the solder layer.

2. The method according to claim 1, wherein the step of forming the resist layer includes thermally curing a resist material deposited on the substrate.

3. The method according to claim 1, wherein the step of forming the metal pillar includes electroplating the first conductive material in the opening of the resist layer so as to leave a cavity from a top surface of the resist layer of a predetermined depth in the opening.

4. The method according to claim 1, wherein the step of forming the metal barrier layer includes electroplating the second conductive material in the opening in which the space has been formed.

5. The method according to claim 1, wherein the step of forming the solder layer includes electroplating a solder material from a top surface of the metal barrier layer to a top surface of the resist layer in the opening of the resist layer.

6. The method according to claim 1, wherein the step of forming the metal barrier layer comprises forming a solder material in the opening in which the space has been formed using an Injection Molded Solder (IMS) process.

7. The method according to claim 1, wherein the first conductive material comprises Cu, and the second conductive material comprises a Ni or Sn based intermetallic compound.

8. The method according to claim 7, wherein the step of forming the at least one conductive layer includes the steps of:
    forming a first conductive layer on the substrate; and
    forming a second conductive layer on the first conductive layer.

9. The method according to claim 8, wherein the first conductive layer comprises Ti or TiW, and the second conductive layer comprises Cu.

10. The method according to claim 8, wherein the step of removing the at least one conductive layer includes etching the second conductive layer.

11. The method according to claim 10, further comprising a step of:
    etching the first conductive layer after the solder bump has been formed.

12. A method of forming a solder bump on a substrate, comprising the steps of:
    forming at least one conductive layer on the substrate, wherein the substrate has a surface on which an electrode pad is prepared;
    forming a resist layer on the at least one conductive layer, the resist layer having an opening over the electrode pad;
    electroplating a first conductive material in the opening of the resist layer to form a metal pillar in the opening of the resist layer;
    heating the resist layer to form a space between a sidewall of the resist layer and a sidewall of the metal pillar;
    forming a metal barrier layer in the space and on a top surface of the metal pillar, wherein the metal barrier layer comprises a second conductive material which is different from the first conductive material of the metal pillar;
    forming a solder layer on the metal barrier layer over the top surface of the metal pillar;
    removing the resist layer;
    etching the at least one conductive layer; and
    reflowing the solder layer to form the solder bump.

13. The method according to claim 12, wherein the step of forming the resist layer includes thermally curing a resist material deposited on the substrate.

14. The method according to claim 13, wherein the step of heating the resist layer includes heating the resist layer at a temperature higher than a temperature which thermally cures the resist material.

15. The method according to claim 12, wherein the step of forming the metal barrier layer includes electroplating the second conductive material in the opening in which the space has been formed.

16. The method according to claim 12, wherein the step of forming the solder layer includes electroplating solder material from a top surface of the metal barrier layer to a top surface of the resist layer in the opening of the resist layer.

17. The method according to claim 12, wherein the step of forming the metal barrier layer comprises forming solder material in the opening in which the space has been formed using an Injection Molded Solder (IMS) process.

18. The method according to claim 12, wherein the first conductive material comprises Cu, and the second conductive material comprises a Ni or Sn based intermetallic compound.

* * * * *